(12) United States Patent
Lai et al.

(10) Patent No.: US 11,973,488 B1
(45) Date of Patent: Apr. 30, 2024

(54) RESONATOR FOR TESTING, METHOD FOR MANUFACTURING RESONATOR FOR TESTING, AND METHOD FOR TESTING RESONATOR

(71) Applicant: Suzhou HunterSun Electronics Co., Ltd., Suzhou (CN)

(72) Inventors: Zhiguo Lai, Suzhou (CN); Qinghua Yang, Suzhou (CN)

(73) Assignee: SUZHOU HUNTERSUN ELECTRONICS CO., LTD., Suzhou (CN)

( * ) Notice: Subject to any disclaimer, the term of this patent is extended or adjusted under 35 U.S.C. 154(b) by 0 days.

(21) Appl. No.: 18/373,212

(22) Filed: Sep. 26, 2023

(30) Foreign Application Priority Data

Sep. 29, 2022 (CN) .......................... 202211194706.7

(51) Int. Cl.
  *H01L 41/053* (2006.01)
  *H01L 21/66* (2006.01)
  (Continued)

(52) U.S. Cl.
  CPC .............. *H03H 9/17* (2013.01); *H01L 22/30* (2013.01); *H03H 3/02* (2013.01); *H03H 9/131* (2013.01); *H03H 9/02007* (2013.01)

(58) Field of Classification Search
  CPC ............................ H03H 9/17; H03H 9/02007
  See application file for complete search history.

(56) References Cited

U.S. PATENT DOCUMENTS

| | | | |
|---|---|---|---|
| 2008/0061907 A1* | 3/2008 | Lee .......................... | H03H 3/02 333/191 |
| 2012/0161902 A1* | 6/2012 | Feng ...................... | H03H 9/175 333/187 |

(Continued)

FOREIGN PATENT DOCUMENTS

| | | |
|---|---|---|
| CN | 111934643 | 11/2020 |
| CN | 113708740 | 11/2021 |

(Continued)

OTHER PUBLICATIONS

Office Action dated Nov. 9, 2022 in Chinese Patent Application No. 202211194706.7.

(Continued)

*Primary Examiner* — Bryan P Gordon
(74) *Attorney, Agent, or Firm* — Snell & Wilmer L.L.P.

(57) ABSTRACT

A resonator for testing, a method for manufacturing a resonator for testing, and a method for testing a resonator are provided. The resonator for testing includes: a testing substrate, a testing bottom electrode, a testing piezoelectric layer, a testing top electrode, at least one first testing electrode, and at least one second testing electrode. The first testing electrode is connected to the testing bottom electrode, the second testing electrode is connected to the testing top electrode, a spacing region is arranged between the first testing electrode and the second testing electrode, and a thickness between the testing piezoelectric layer and at least one of the first testing electrode and the second testing electrode is greater than a predetermined thickness to insulate the first testing electrode and the second testing electrode. With the technical solutions according to the present disclosure, the accuracy of the detected resonance frequency adjustment amount caused by the mass loading layer to be tested is improve.

7 Claims, 9 Drawing Sheets

(51) Int. Cl.
      *H03H 3/02*       (2006.01)
      *H03H 9/13*       (2006.01)
      *H03H 9/17*       (2006.01)
      *H03H 9/02*       (2006.01)

(56) References Cited

U.S. PATENT DOCUMENTS

| | | | |
|---|---|---|---|
| 2013/0127300 A1* | 5/2013 | Umeda | H03H 9/173 310/365 |
| 2014/0225683 A1* | 8/2014 | Burak | H03H 9/173 333/187 |
| 2017/0093368 A1* | 3/2017 | Choy | H03H 9/54 |
| 2018/0159503 A1* | 6/2018 | Takano | B23K 1/0016 |

FOREIGN PATENT DOCUMENTS

| | | |
|---|---|---|
| CN | 113872555 | 12/2021 |
| CN | 114070232 | 2/2022 |
| CN | 115037264 | 9/2022 |

OTHER PUBLICATIONS

Notification of Patent Grant dated Nov. 25, 2022 in Chinese Patent Application No. 202211194706.7.

* cited by examiner

RESONATOR FOR TESTING, METHOD FOR MANUFACTURING RESONATOR FOR TESTING, AND METHOD FOR TESTING RESONATOR

CROSS REFERENCE TO RELATED APPLICATIONS

This application claims priority to, and the benefit of, Chinese Patent Application No. 202211194706.7 filed Sep. 29, 2022 entitled "RESONATOR FOR TESTING, METHOD FOR MANUFACTURING RESONATOR FOR TESTING, AND METHOD FOR TESTING RESONATOR". The foregoing application is hereby incorporated by reference in its entirety for all purposes.

TECHNICAL FIELD

The present disclosure relates to the technical field of semiconductors, and in particular to a resonator for testing, a method for manufacturing a resonator for testing, and a method for testing a resonator.

BACKGROUND

Film Bulk Acoustic Resonator (FBAR), as an important member of piezoelectric devices, plays an important role in the field of communication. The film bulk acoustic resonators, film bulk acoustic filters including the film bulk acoustic resonators, and duplexers have excellent features such as small size, high resonance frequency, high quality factor, large power capacity, and good roll off effect.

The film bulk acoustic resonator has a "sandwich" structure which includes a bottom electrode, a piezoelectric layer, and a top electrode. That is, a layer of piezoelectric material is sandwiched between two metal electrode layers. By inputting a sinusoidal signal between two electrodes, the film bulk acoustic resonator converts an inputted electrical signal to mechanical resonance based on an inverse piezoelectricity effect. Then, the film bulk acoustic resonator converts the mechanical resonance to an electrical signal based on a piezoelectricity effect and outputs the electrical signal. According to the conventional technology, it has been proposed to configure a mass loading layer in the film bulk acoustic resonator to adjust the resonant frequency of the film bulk acoustic resonator, and film bulk acoustic filters and diplexers, with required bandwidths, are obtained by combining and matching film bulk acoustic resonators with different frequencies.

However, the technical problem in the conventional technology is that multiple process steps exist between the step of forming the mass loading layer and the step of detecting a resonance frequency adjustment amount caused by the mass loading layer, might result in detecting a low-accurate resonance frequency adjustment amount caused by the mass loading layer due to fluctuations of the process steps (caused by equipment abnormalities, raw material abnormalities, abnormal process parameter configurations, and the like).

SUMMARY

A resonator for testing, a method for manufacturing a resonator for testing, and a method for testing a resonator are provided according to the present disclosure to improve the accuracy of the detected resonance frequency adjustment amount caused by the mass loading layer to be tested.

According to an aspect of the present disclosure, a resonator for testing is provided. The resonator for testing includes: a testing substrate, a testing bottom electrode, a testing piezoelectric layer, a testing top electrode, at least one first testing electrode, and at least one second testing electrode.

The first testing electrode is connected to the testing bottom electrode. The second testing electrode is connected to the testing top electrode. A spacing region is arranged between the first testing electrode and the second testing electrode. A thickness between the testing piezoelectric layer and at least one of the first testing electrode and the second testing electrode is greater than a predetermined thickness to insulate the first testing electrode and the second testing electrode.

In an embodiment, the second testing electrode forms a suspended wing structure of the testing top electrode, and the suspended wing structure is arranged at an edge of the testing top electrode.

In an embodiment, a first support structure and a second support structure with a space interval are arranged on a side of the testing piezoelectric layer away from the testing bottom electrode. The first testing electrode is arranged on a side of the first support structure away from the testing piezoelectric layer, and the first testing electrode passes through through holes on the first support structure and on the testing piezoelectric layer and then is connected to the testing bottom electrode. The second testing electrode is arranged on a side of the second support structure away from the testing piezoelectric layer, and is connected to the testing top electrode. An orthographic projection of the first support structure on the testing substrate is arranged to be within an orthographic projection of the first testing electrode on the testing substrate, and/or an orthographic projection of the second support structure on the testing substrate is arranged to be within an orthographic projection of the second testing electrode on the testing substrate.

In an embodiment, a first insulation layer is arranged on a surface of the first testing electrode opposite to the second testing electrode, and/or a second insulation layer is arranged on a surface of the second testing electrode opposite to the first testing electrode.

In an embodiment, the resonator for testing further includes a testing mass loading layer. The testing mass loading layer covers the first testing electrode, the second testing electrode and the spacing region.

In an embodiment, the testing piezoelectric layer is defined with a groove. An orthographic projection of the groove on the testing piezoelectric layer covers an orthographic projection of the spacing region on the testing piezoelectric layer to insulate the first testing electrode and the second testing electrode after the testing mass loading layer is formed.

In an embodiment, a minimum size of an orthographic projection of the spacing region in a first direction is greater than twice the thickness of the testing mass loading layer. The first direction is an extension direction of the testing substrate.

In an embodiment, a difference between a height of the first testing electrode and a height of the second testing electrode in a second direction is greater than twice the thickness of the testing mass loading layer. The second direction is perpendicular to a plane where the testing substrate is located.

In an embodiment, the predetermined thickness is greater than or equal to a thickness of the testing mass loading layer.

According to another aspect of the present disclosure, a method for testing a resonator is provided. The method includes: obtaining a semiconductor structure, where the semiconductor structure includes at least a substrate; forming a mass loading layer to be tested on a surface of the semiconductor structure by performing a thin film process; forming a testing mass loading layer on a surface of the resonator for testing by performing the thin film process, and determining a resonant frequency adjustment amount of the testing mass loading layer to the resonator for testing; and in a case that the resonant frequency adjustment amount of the testing mass loading layer to the resonator for testing meets a predetermined value, forming a preset film layer on a side of the mass loading layer to be tested away from the substrate, where the mass loading layer to be tested, the preset film layer, and the semiconductor structure form the resonator.

In an embodiment, the determining a resonant frequency adjustment amount of the testing mass loading layer to the resonator for testing includes: determining a resonant frequency adjustment amount of the mass loading layer to be tested to the semiconductor structure based on the resonant frequency adjustment amount of the testing mass loading layer to the resonator for testing.

In an embodiment, the determining a resonant frequency adjustment amount of the testing mass loading layer to the resonator for testing includes: obtaining the resonator for testing, where the resonator for testing includes: a testing substrate, a testing bottom electrode, a testing piezoelectric layer, and a testing top electrode, a first testing electrode is connected to the testing bottom electrode, and a second testing electrode is connected to the testing top electrode; detecting a resonant frequency of the resonator for testing to obtain a first resonant frequency; forming the testing mass loading layer on a side of the testing top electrode away from the testing piezoelectric layer by performing the thin film process; detecting a resonant frequency of the resonator for testing to obtain a second resonant frequency; and based on a difference between the second resonant frequency and the first resonant frequency, determining the resonant frequency adjustment amount of the testing mass loading layer to the resonator for testing.

In an embodiment, the determining a resonant frequency adjustment amount of the mass loading layer to be tested to the semiconductor structure based on the resonant frequency adjustment amount of the testing mass loading layer to the resonator for testing includes: determining the resonant frequency adjustment amount of the mass loading layer to be tested to the semiconductor structure based on a proportional relationship between a thickness of the mass loading layer to be tested and the thickness of the testing mass loading layer and the resonant frequency adjustment amount of the testing mass loading layer to the resonator for testing.

In an embodiment, before forming the testing mass loading layer on the surface of the resonator for testing by performing the thin film process, the method includes: in a case that an initial mass loading layer exists on the surface of the resonator for testing, detecting a thickness of the initial mass loading layer; and in a case of determining that the thickness of the initial mass loading layer is abnormal, removing a part or all of the initial mass loading layer.

In an embodiment, the determining that the thickness of the initial mass loading layer is abnormal includes: determining that a vertical spacing distance between the initial mass loading layer between the first testing electrode and the second testing electrode and the first testing electrode is less than or equal to the thickness of the testing mass loading layer and a vertical spacing distance between the initial mass loading layer between the first testing electrode and the second testing electrode and the second testing electrode is less than or equal to the thickness of the testing mass loading layer.

In an embodiment, the testing mass loading layer includes the conductive testing mass loading layer, then the detecting a resonant frequency of the resonator for testing includes: inserting a probe in a testing mass loading layer covering the first testing electrode and inserting the probe in a testing mass loading layer covering the second testing electrode to detect the resonant frequency of the resonator for testing. Alternatively, the testing mass loading layer includes an insulation testing mass loading layer, then the detecting a resonant frequency of the resonator for testing includes: inserting a probe in the first testing electrode through the testing mass loading layer and inserting the probe in the second testing electrode through the testing mass loading layer to detect the resonant frequency of the resonator for testing.

According to another aspect of the present disclosure, a method for manufacturing a resonator for testing is provided. The method includes: manufacturing a testing substrate, a testing bottom electrode, a testing piezoelectric layer, and a testing top electrode; and forming at least one first testing electrode and at least one second testing electrode for an insulation configuration. The first testing electrode is connected to the testing bottom electrode, the second testing electrode is connected to the testing top electrode, a spacing region is arranged between the first testing electrode and the second testing electrode, and a thickness between the testing piezoelectric layer and at least one of the first testing electrode and the second testing electrode is greater than a predetermined thickness.

In an embodiment, the forming at least one first testing electrode and at least one second testing electrode for an insulation configuration includes: arranging a first support structure and a second support structure with a space interval on a side of the testing piezoelectric layer away from the testing bottom electrode; defining through holes in the first support structure and the testing piezoelectric layer; forming the first testing electrode on a side of the first support structure away from the testing piezoelectric layer, where the first testing electrode passes through the through holes and then is connected to the testing bottom electrode; and forming the second testing electrode on a side of the second support structure away from the testing piezoelectric layer, where the second testing electrode is connected to the testing top electrode. An orthographic projection of the first support structure on the testing substrate is arranged to be within an orthographic projection of the first testing electrode on the testing substrate, and/or an orthographic projection of the second support structure on the testing substrate is arranged to be within an orthographic projection of the second testing electrode on the testing substrate.

In an embodiment, the forming at least one first testing electrode and at least one second testing electrode for an insulation configuration includes: forming the at least one first testing electrode and the at least one second testing electrode on a side of the testing piezoelectric layer away from the testing bottom electrode; and arranging a first insulation layer on a surface of the first testing electrode opposite to the second testing electrode, and/or arranging a second insulation layer on a surface of the second testing electrode opposite to the first testing electrode.

In an embodiment, after forming the at least one first testing electrode and the at least one second testing electrode for the insulation configuration, the method further includes: forming a testing mass loading layer. The testing mass loading layer covers the first testing electrode, the second testing electrode and the spacing region.

In an embodiment, the testing piezoelectric layer is manufactured by: forming a groove on a surface of the testing piezoelectric layer. An orthographic projection of the groove on the testing piezoelectric layer covers an orthographic projection of the spacing region on the testing piezoelectric layer to insulate the first testing electrode and the second testing electrode after the testing mass loading layer is formed.

In the technical solutions according to the present disclosure, the first testing electrode and the second testing electrode in the resonator for testing are insulated, avoiding the problem that the resonant frequency adjustment amount of the testing mass loading layer to the resonator for testing cannot be detected due to a short circuit between the first testing electrode and the second testing electrode after the testing mass loading layer is formed, thereby ensuring that the testing process can be completed. In addition, after forming the mass loading layer to be tested on the surface of the semiconductor structure and before forming a next film layer, it is determined that the resonant frequency adjustment amount of the testing mass loading layer to the resonator for testing meets a predetermined value, thereby online ensuring that the resonant frequency adjustment amount of the mass loading layer to be tested to the semiconductor structure meets a production requirement, and avoiding the technical problem in the conventional technology that multiple process steps exist between the step of forming the mass loading layer to be tested and the step of detecting the resonance frequency adjustment amount caused by the mass loading layer to be tested and a low-accurate resonance frequency adjustment amount caused by the detected mass loading layer to be tested due to fluctuations of the process steps (caused by equipment abnormalities, raw material abnormalities, abnormal process parameter configurations, and the like). With the technical solutions according to the present disclosure, the accuracy of the measurement result of the resonant frequency adjustment amount of the mass loading layer to be tested to the semiconductor structure is improved.

It should be understood that the above descriptions are not intended to identify keys or important features of the embodiments of the present disclosure or to limit the scope of the present disclosure. Other features of the present disclosure are to be easily understood through the following specification.

BRIEF DESCRIPTION OF THE DRAWINGS

The drawings to be used in the description of the embodiments are described briefly as follows, so that the technical solutions according to the embodiments of the present disclosure become clearer. It is apparent that the drawings in the following description only illustrate some embodiments of the present disclosure. For those skilled in the art, other drawings may be obtained according to these drawings without any creative work.

DETAILED DESCRIPTION OF THE EMBODIMENTS

In order to make those skilled in the art understand the solutions in the present disclosure, the technical solutions in the embodiments of the present disclosure are clearly and completely described hereinafter in conjunction with the drawings of the embodiments of the present disclosure. Apparently, the described embodiments are only part embodiments of the present disclosure, rather than all embodiments. Other embodiments obtained by those skilled in the art without any creative efforts based on the embodiments of the present disclosure fall within the protection scope of the present disclosure.

It should be noted that the terms "first", "second" and the like in the description, claims and the accompanying drawings of the present disclosure are used to distinguish similar objects rather than to describe a sequence or an order. It should be understood that the data used in this way may be interchanged in appropriate situations, so that the embodiments of the present disclosure may be implemented in order other than those illustrated or described herein. In addition, the terms "including" and "having" and their variants are intended to cover non-exclusive inclusions For example, a process, a method, a system, a product, or a device that includes a series of steps or devices is not limited to those clearly listed steps or devices, and may include other steps or devices that are not clearly listed or inherent to the process, the method, the product, or the device.

It should be noted that in the embodiments of the present disclosure, a method for testing a resonator is first introduced, and then a resonator for testing and a method for manufacturing a resonator for testing are introduced.

In order to improve the accuracy of the detected resonance frequency adjustment amount caused by the mass loading layer to be tested, the following technical solutions are provided according to the present disclosure.

Figure 1:
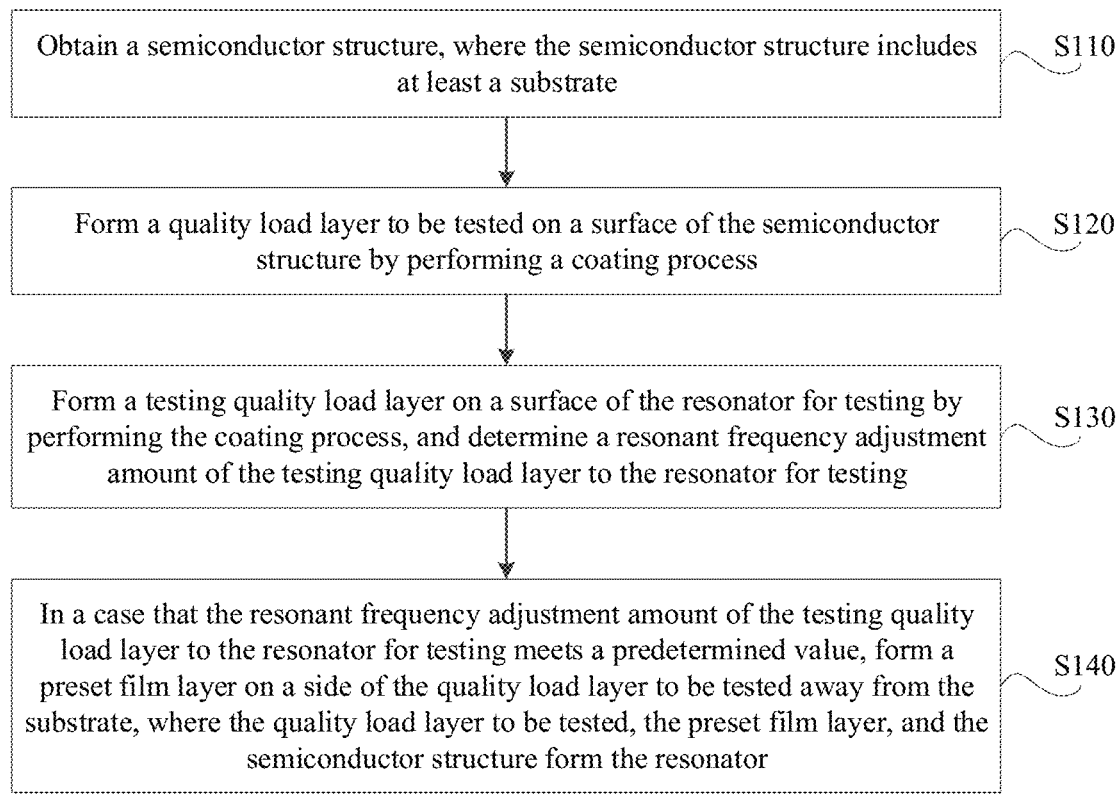
FIG. 1 is a flow chart of a method for testing a resonator according to the present disclosure.

Reference is made to FIG. 1, which is a flow chart of a method for testing a resonator according to the present disclosure. The method for testing a resonator includes the following steps S110 to S140.

In step S110, a semiconductor structure is obtained. The semiconductor structure at least includes a substrate.

Figure 2:
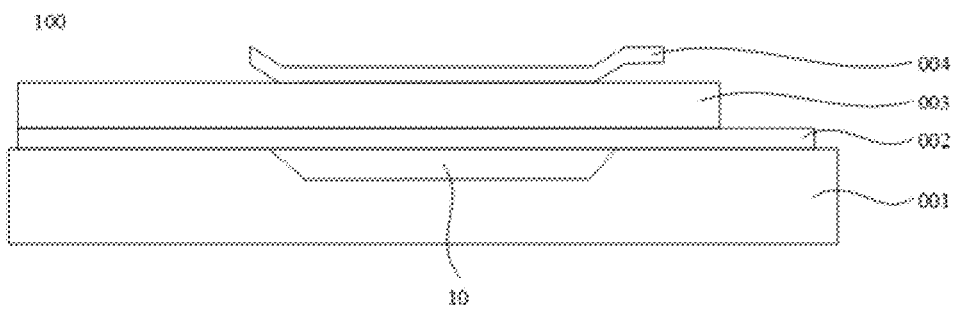
FIGS. 2 to 7 are schematic structural diagram corresponding to steps of a method for testing a resonator according to the present disclosure.

Referring to FIG. 2, which exemplary shows a semiconductor structure 100 that includes a substrate 001, a bottom electrode 002, a piezoelectric layer 003 and a top electrode 004. The semiconductor structure 100 is a film bulk acoustic resonator. In order to improve the quality factors of the semiconductor structure 100, an acoustic reflection structure, such as a cavity structure 10, is further arranged in the substrate 001. It should be noted that in other embodiments, the semiconductor structure 100 in the present disclosure may be a semiconductor structure including the substrate 001, a semiconductor structure including the substrate 001 and the bottom electrode 002, or a semiconductor structure including the substrate 001, the bottom electrode 002, and the piezoelectric layer 003.

In step S120, a mass loading layer to be tested is formed on a surface of the semiconductor structure by performing a thin film process.

Figure 3:
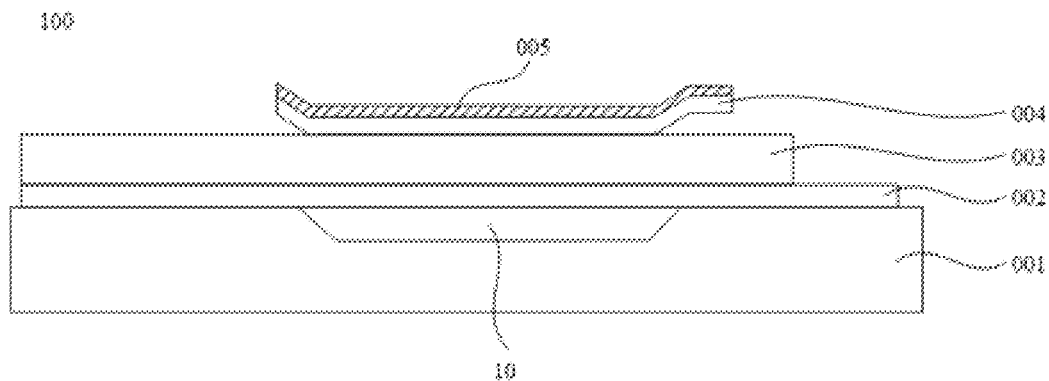

Referring to FIG. 3, which shows a schematic structural diagram of a semiconductor structure 100 after a mass loading layer 005 to be tested is formed on a surface of the semiconductor structure 100 by performing a thin film process. The mass loading layer 005 to be tested is arranged to adjust the resonant frequency of the semiconductor structure 100. The material of the mass loading layer 005 to be tested may be a conductive material or an insulation material. It should be noted that since the semiconductor structure 100 includes at least the substrate 001, in the present disclosure, the mass loading layer 005 to be tested may be arranged on the top electrode 004 shown in FIG. 3. In a case that the semiconductor structure 100 only includes the substrate 001, the mass loading layer 005 to be tested is arranged on the substrate 001. In a case that the semiconductor structure 100 includes the substrate 001 and the bottom electrode 002, the mass loading layer 005 to be tested is arranged on the bottom electrode 002. In a case that the semiconductor structure 100 includes the substrate 001, the bottom electrode 002 and the piezoelectric layer 003, the mass loading layer 005 to be tested is arranged on the piezoelectric layer 003.

In step S130, a testing mass loading layer is formed on a surface of the resonator for testing by performing the thin film process, and a resonant frequency adjustment amount of the testing mass loading layer to the resonator for testing is determined.

Figure 4:
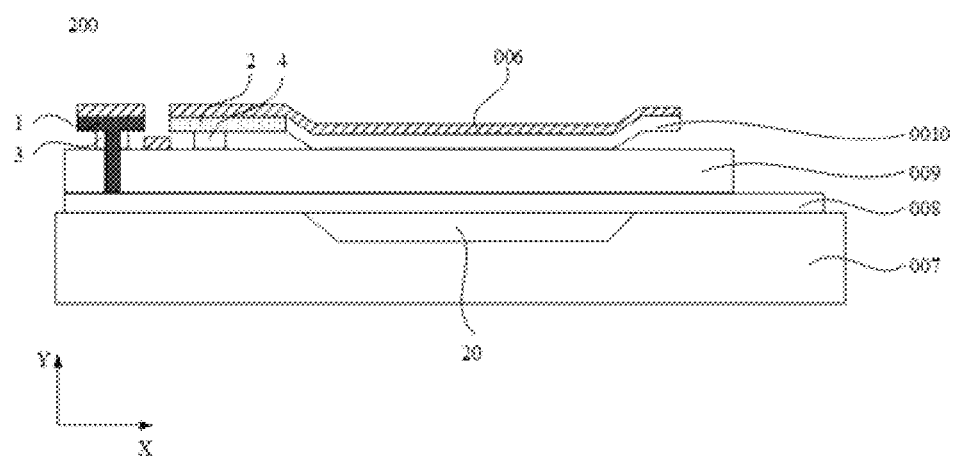
Figure 5:
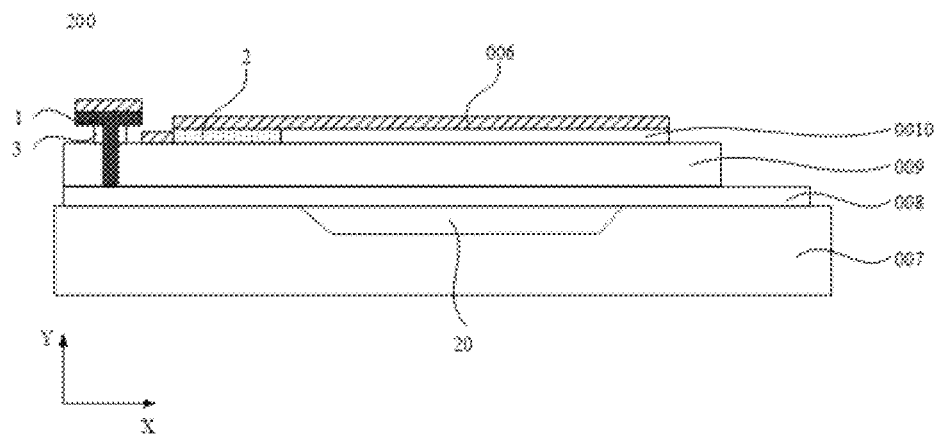
Figure 6:
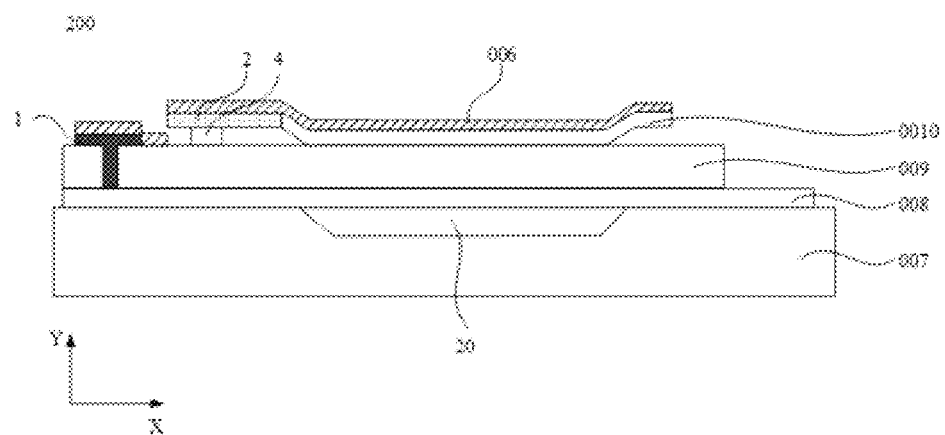

Referring to FIGS. 4 to 6, which show schematic structural diagrams of a resonator 200 for testing with a testing mass loading layer 006 formed on the resonator 200 for testing. The testing mass loading layer 006 is formed on a surface of the resonator 200 for testing by performing the thin film process. The resonator 200 for testing includes a testing substrate 007, a testing bottom electrode 008, a testing piezoelectric layer 009, and a testing top electrodes 0010. The testing substrate 007 is arranged with an acoustic reflection structure, such as a cavity structure 20.

The resonator 200 for testing includes at least one first testing electrode 1, at least one second testing electrode 2. The first testing electrode 1 is connected to the testing bottom electrode 008, and the second testing electrode 2 is connected to the testing top electrode 0010. A spacing region is arranged between the first testing electrode 1 and the second testing electrode 2, that is, the first testing electrode 1 and the second testing electrode 2 are arranged with a space interval. A thickness between the testing piezoelectric layer 009 and at least one of the first testing electrode 1 and the second testing electrode 2 is greater than a predetermined thickness, so that the first testing electrode 1 and the second testing electrode 2 are insulated. Specifically, in FIG. 4, both a thickness between the first testing electrode 1 and the testing piezoelectric layer 009 and a thickness between the second testing electrode 2 and the testing piezoelectric layer 009 are greater than the predetermined thickness, so that the first testing electrode 1 and the second testing electrode 2 are insulated; in FIG. 5, the second testing electrode 2 is arranged on a surface of the testing piezoelectric layer 009, and a thickness between the first testing electrode 1 and the testing piezoelectric layer 009 is greater than the predetermined thickness, so that the first testing electrode 1 and the second testing electrode 2 are insulated; and in FIG. 6, a part of the first testing electrode 1 is arranged on a surface of the testing piezoelectric layer 009, and a thickness between the second testing electrode 2 and the testing piezoelectric layer 009 is greater than the predetermined thickness, so that the first testing electrode 1 and the second testing electrode 2 are insulated.

Figure 7:
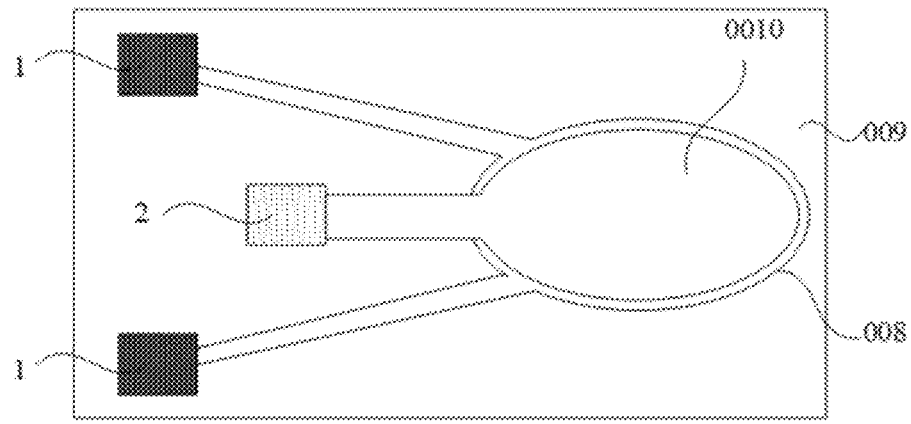

Referring to FIG. 7, which shows a top view of a resonator 200 for testing. As an example, FIG. 7 shows two first testing electrodes 1 and one second testing electrode 2, and the second testing electrode 2 is arranged between the two first testing electrodes 1. It should be understood that in the present disclosure, the number and position arrangement of the first testing electrode 1 and the second testing electrode 2 include, but are not limited to, the technical solution shown in FIG. 7. In practical applications, arrangement may be performed according to application requirements.

It should be noted that after a testing mass loading layer 006 is formed on the resonator 200 for testing as shown in FIGS. 4 to 6, the testing mass loading layer 006 covers the first testing electrode 1, the second testing electrode 2, and a spacing region between the first testing electrode 1 and the second testing electrode 2. In a case that both the thickness between the first testing electrode 1 and the testing piezoelectric layer 009 and the thickness between the second testing electrode 2 and the testing piezoelectric layer 009 are less than the thickness of the testing mass loading layer 006, if the material of the testing mass loading layer 006 is a conductive material, it cannot be guaranteed that the first testing electrode 1 and the second testing electrode 2 are insulated, and, and it cannot to apply different electrical signals to the first testing electrode 1 and the second testing electrode 2 to test and determine a resonant frequency adjustment amount of the testing mass loading layer to the resonator 200 for testing. Therefore, in the present disclosure, the predetermined thickness is greater than or equal to a thickness of the testing mass loading layer 006. Based on the above solutions, it may be avoided the problem that the resonant frequency adjustment amount of the testing mass loading layer 006 to the resonator 200 for testing cannot be detected due to a short circuit between the first testing electrode 1 and the second testing electrode 2 after the testing mass loading layer 006 is formed.

Due to that the thin film process performed for forming the testing mass loading layer 006 is identical to the thin film process performed for forming the mass loading layer 005 to be tested, the quality differences caused by the testing mass loading layer 006 and the mass loading layer 005 arranged on different structures may be ignored. Then, it may be determined that in a case that the resonant frequency adjustment amount of the testing mass loading layer 006 to the resonator 200 for testing meets a predetermined value, the resonant frequency adjustment amount of the mass loading layer 005 to be tested to the semiconductor structure 100 meets a production requirement, then step S140 is performed.

In step S140, in a case that the resonant frequency adjustment amount of the testing mass loading layer to the resonator for testing meets a predetermined value, a preset film layer is formed on a side of the mass loading layer to be tested away from the substrate, where the mass loading layer to be tested, the preset film layer, and the semiconductor structure form the resonator.

After the mass loading layer 005 to be tested is formed and the resonant frequency adjustment amount of the testing mass loading layer 006 to the resonator for testing is determined in step S130, in a case that it is determined that the resonant frequency adjustment amount of the testing mass loading layer 006 to the resonator for testing meets a predetermined value, a preset film layer may be formed on a side of the mass loading layer 005 to be tested away from the substrate 001. The mass loading layer 005 to be tested, the preset film layer and the semiconductor structure 100 form the resonator.

In the technical solutions according to the present disclosure, after forming the mass loading layer 005 to be tested on the surface of the semiconductor structure 100 and before forming a next film layer, it is determined that the resonant frequency adjustment amount of the testing mass loading layer 006 to the resonator 200 for testing meets a predetermined value, thereby online ensuring that the resonant frequency adjustment amount of the mass loading layer 005 to be tested to the semiconductor structure 100 meets a production requirement, and avoiding the technical problem in the conventional technology that multiple process steps exist between the step of forming the mass loading layer 005 to be tested and the step of detecting the resonance frequency adjustment amount caused by the mass loading layer 005 to be tested and a low-accurate resonance frequency adjustment amount caused by the detected mass loading layer to be tested due to fluctuations of the process steps (caused by equipment abnormalities, raw material abnormalities, abnormal process parameter configurations, and the like). With the technical solutions according to the present disclosure, the accuracy of the measurement result of the resonant frequency adjustment amount of the mass loading layer 005 to be tested to the semiconductor structure 100 is improved. According to the present disclosure, after the testing mass loading layer 006 is formed on the resonator 200 for testing, the first testing electrode 1 and the second testing electrode 2 are insulated, avoiding the problem that the resonant frequency adjustment amount of the testing mass loading layer 006 to the resonator 200 for testing cannot be detected due to a short circuit between the first testing electrode 1 and the second testing electrode 2 after the testing mass loading layer 006 is formed, thereby ensuring that the testing process can be completed.

In an embodiment, based on the above technical solutions, the step S130 in which the resonant frequency adjustment amount of the testing mass loading layer to the resonator for testing is determined in FIG. 1 further includes: determining a resonant frequency adjustment amount of the mass loading layer to be tested to the semiconductor structure based on the resonant frequency adjustment amount of the testing mass loading layer to the resonator for testing.

Due to the thin film process performed for forming the testing mass loading layer 006 is identical to the thin film process performed for forming the mass loading layer 005 to be tested, the quality differences caused by the testing mass loading layer 006 and the mass loading layer 005 arranged on different structures may be ignored. Then, the resonant frequency adjustment amount of the mass loading layer 005 to be tested to the semiconductor structure 100 may be determined based on the resonant frequency adjustment amount of the testing mass loading layer 006 to the resonator 200 for testing.

In the above technical solutions, it is unnecessary to directly test the semiconductor structure 100. The resonant frequency adjustment amount of the mass loading layer 005 to be tested to the semiconductor structure 100 may be determined based on the resonant frequency adjustment amount of the testing mass loading layer 006 to the resonator 200 for testing. Then, in a case that it is determined that the resonant frequency adjustment amount of the testing mass loading layer 006 to the resonator 200 for testing meets a predetermined value, it is online ensured that the resonant frequency adjustment amount of the mass loading layer 005 to be tested to the semiconductor structure 100 meets a production requirement.

Figure 8:
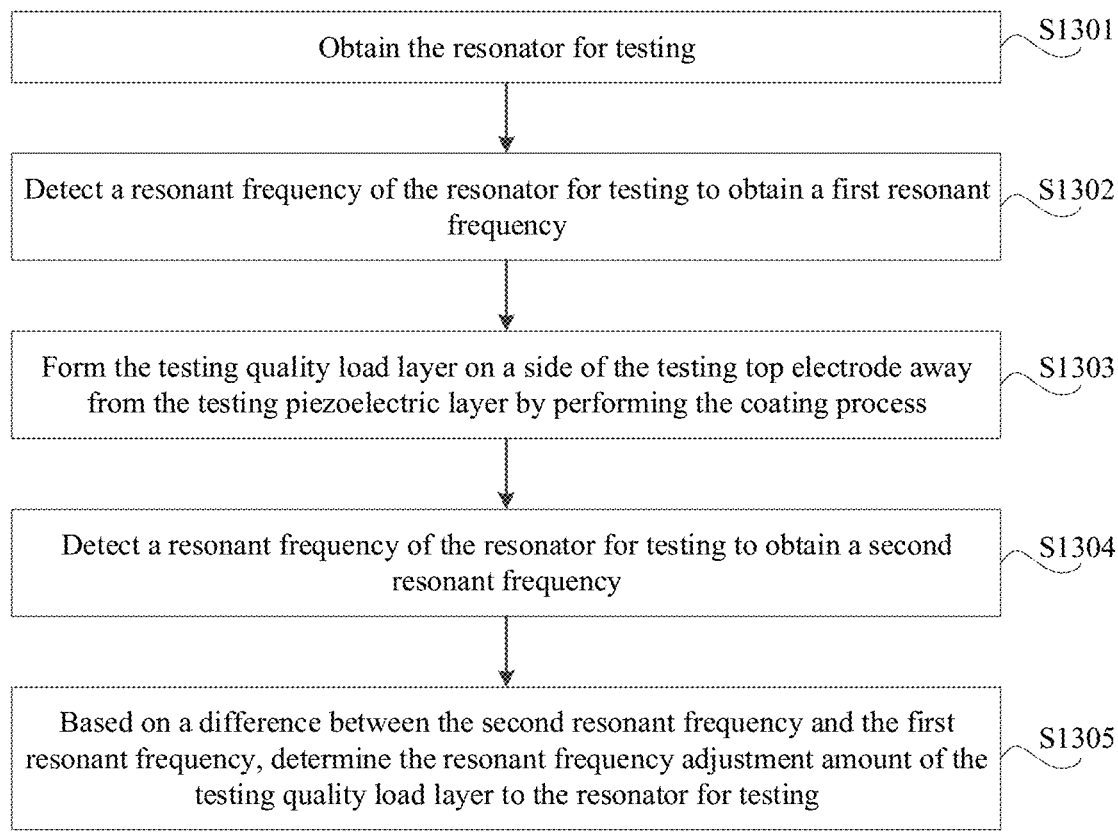
FIG. 8 is a flow chart of S130 in FIG. 1.

In an embodiment, based on the above technical solutions, reference is made to FIG. 8, which is a flow chart of S130 in FIG. 1. The step, in which the testing mass loading layer is formed on the surface of the resonator for testing by performing the thin film process and the resonant frequency adjustment amount of the testing mass loading layer to the resonator for testing is determined, includes the following steps S1301 to S1305.

In step S1301, the resonator for testing is obtained.

Figure 9:
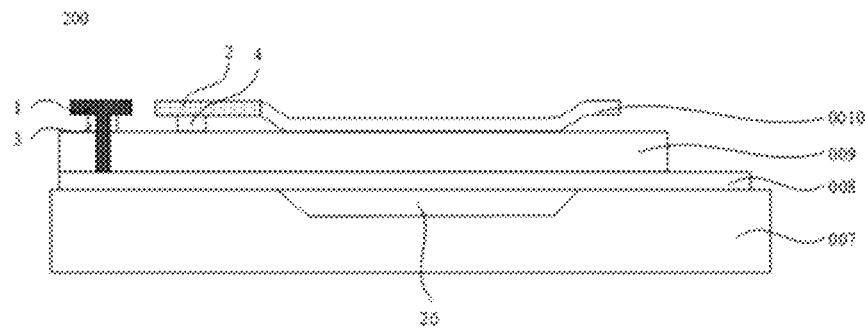
FIGS. 9 to 11 are schematic structural diagram corresponding to S130.
Figure 10:
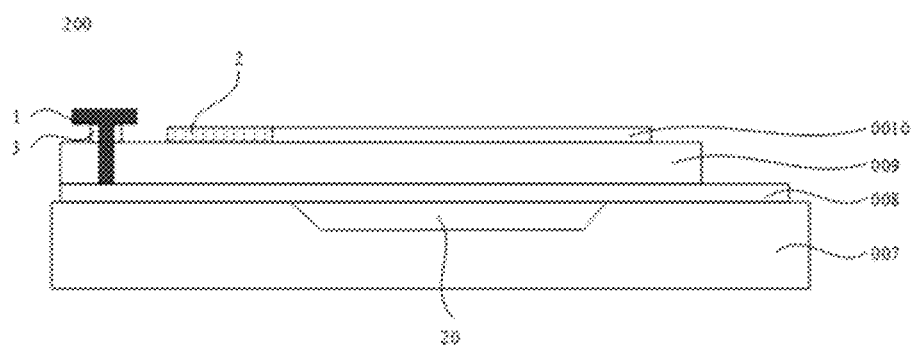
Figure 11:
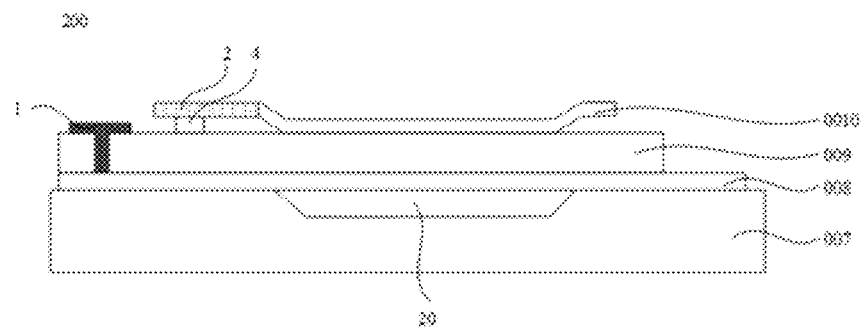

Reference is made to FIGS. 9 to 11, which show schematic structural diagrams of a resonator 200 for testing. The resonator 200 for testing includes a testing substrate 007, a testing bottom electrode 008, a testing piezoelectric layer 009, and a testing top electrode 0010. The first testing electrode 1 is connected to the testing bottom electrode 008, and the second testing electrode 2 is connected to the testing top electrode 0010. A spacing region is arranged between the first testing electrode 1 and the second testing electrode 2. A thickness between the testing piezoelectric layer 009 and at least one of the first testing electrode 1 and the second testing electrode 2 is greater than a predetermined thickness, so that the first testing electrode 1 and the second testing electrode 2 are insulated. In FIG. 9, both a thickness between the first testing electrode 1 and the testing piezoelectric layer 009 and a thickness between the second testing electrode 2 and the testing piezoelectric layer 009 are greater than the predetermined thickness, so that the first testing electrode 1 and the second testing electrode 2 are insulated. In FIG. 10, a thickness between the first testing electrode 1 and the testing piezoelectric layer 009 is greater than the predetermined thickness, so that the first testing electrode 1 and the second testing electrode 2 are insulated. In FIG. 11, a thickness between the second testing electrode 2 and the testing piezoelectric layer 009 is greater than the predetermined thickness, so that the first testing electrode 1 and the second testing electrode 2 are insulated.

In step S1302, a resonant frequency of the resonator for testing is detected to obtain a first resonant frequency.

A probe is inserted on the first testing electrode 1 and the second testing electrode 2, different electrical signals are applied to the first testing electrode 1 and the second testing electrode 2, and then the resonant frequency of the resonator 200 for testing is detected to obtain the first resonant frequency.

In step S1303, the testing mass loading layer is formed on a side of the testing top electrode away from the testing piezoelectric layer by performing the thin film process.

Referring to FIGS. 4 to 6, the testing mass loading layer 006 is formed on a surface of the resonator 200 for testing by performing the thin film process. The resonator 200 for testing includes at least one first testing electrode 1 and at least one second testing electrode 2. The testing mass loading layer 006 covers the first testing electrode 1, the second testing electrode 2, and the spacing region between the first testing electrode 1 and the second testing electrode 2. The first testing electrode 1 and the second testing electrode 2 are insulated.

In step S1304, a resonant frequency of the resonator for testing is detected to obtain a second resonant frequency.

The probe is inserted on the first testing electrode 1 and the second testing electrode 2, different electrical signals are applied to the first testing electrode 1 and the second testing electrode 2, and then the resonant frequency of the resonator 200 for testing is detected to obtain the second resonant frequency.

In step S1305, based on a difference between the second resonant frequency and the first resonant frequency, the resonant frequency adjustment amount of the testing mass loading layer to the resonator for testing is determined.

The first resonant frequency is detected before forming the testing mass loading layer 006 on the surface of the resonator 200 for testing and the second resonant frequency is detected after forming the testing mass loading layer 006, so that the change in the resonant frequency of the resonator 200 for testing is caused by the formation of the testing mass loading layer 006. Therefore, in the present disclosure, the resonant frequency adjustment amount caused by the testing mass loading layer 006 may be determined based on the difference between the second resonant frequency and the first resonant frequency.

In an embodiment, the step, in which the resonant frequency adjustment amount of the mass loading layer to be tested to the semiconductor structure is determined based on the resonant frequency adjustment amount of the testing mass loading layer to the resonator for testing, includes: determining the resonant frequency adjustment amount of the mass loading layer to be tested to the semiconductor structure based on a proportional relationship between a thickness of the mass loading layer to be tested and the thickness of the testing mass loading layer and the resonant frequency adjustment amount of the testing mass loading layer to the resonator for testing. It should be understood that the above solution holds true under a certain condition. For example, in a case that the thickness of the mass loading layer to be tested and the thickness of the testing mass loading layer do not differ significantly, the resonant frequency adjustment amount of the mass loading layer to be tested to the semiconductor structure may be determined based on a proportional relationship between the thickness of the mass loading layer to be tested and the thickness of the testing mass loading layer and the resonant frequency adjustment amount of the testing mass loading layer to the resonator for testing.

In the present disclosure, it is assumed that h1 represents the thickness of the testing mass loading layer 006, f1 represents the resonant frequency adjustment amount of the testing mass loading layer 006 to the resonator for testing, and h2 represents the thickness of the mass loading layer 005 to be tested, then the resonant frequency adjustment amount f2 of the mass loading layer 005 to be tested to the semiconductor structure 100 meets the following equation:

$$f2 = f1 \times h2/h1 \quad (1)$$

In a first case, as shown in FIGS. 3 and 4, the thickness h1 of the testing mass loading layer 006 is equal to the thickness h2 of the mass loading layer 005 to be tested, then the resonant frequency adjustment amount of the resonator 200 for testing is equal to the resonant frequency adjustment amount of the mass loading layer 005 to be tested to the semiconductor structure 100.

Due to that the thickness of the testing mass loading layer 006 is equal to the thickness of the mass loading layer 005 to be tested and the thin film process performed for forming the testing mass loading layer 006 is identical to the thin film process performed for forming the mass loading layer 005 to be tested, the quality differences caused by the testing mass loading layer 006 and the mass loading layer 005 arranged on different structures may be ignored. According to the equation (1), the resonant frequency adjustment amount of the resonator 200 for testing is equal to the resonant frequency adjustment amount of the mass loading layer 005 to be tested to the semiconductor structure 100.

Figure 12:
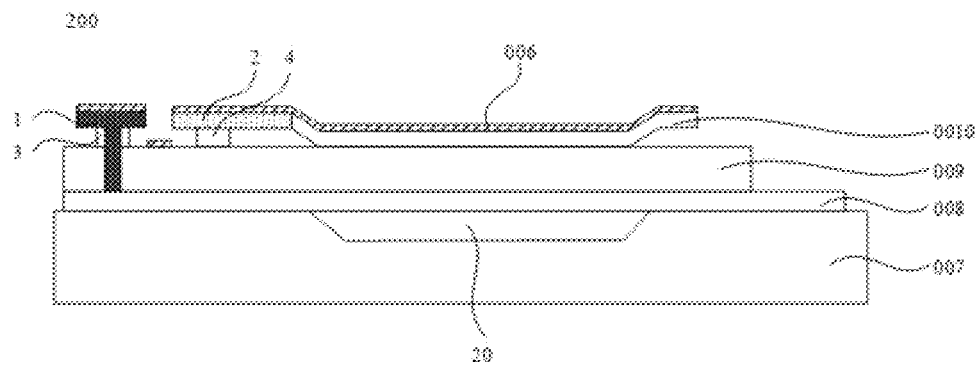
FIG. 12 is a schematic structural diagram of a resonator for testing according to a first embodiment of the present disclosure.

In a second case, as shown in FIGS. 3 and 12, the thickness of the mass loading layer 005 to be tested is greater than the thickness of the testing mass loading layer 006. According to the equation (1), the resonant frequency adjustment amount f2 of the mass loading layer 005 to be tested to the semiconductor structure 100 may be determined based on a product of the proportional relationship between the thickness of the mass loading layer 005 to be tested and the thickness of the testing mass loading layer 006 and the resonant frequency adjustment amount f1 of the testing mass loading layer 006 to the resonator 200 for testing.

Although the thickness of the mass loading layer 005 to be tested is different from the thickness of the testing mass loading layer 006, the thin film process performed for forming the testing mass loading layer 006 is identical to the thin film process performed for forming the mass loading layer 005 to be tested, thus the quality differences caused by the testing mass loading layer 006 and the mass loading layer 005 arranged on different structures may be ignored. Therefore, the resonant frequency adjustment amount of the mass loading layer 005 to be tested to the semiconductor structure 100 may be determined based on the proportional relationship between the thickness of the mass loading layer 005 to be tested and the thickness of the testing mass loading layer 006 and the resonant frequency adjustment amount of the testing mass loading layer 006 to the resonator 200 for testing.

In order to make the resonator 200 for testing according to the present disclosure used multiple times, the following technical solutions are further provided in the present disclosure.

Figure 13:
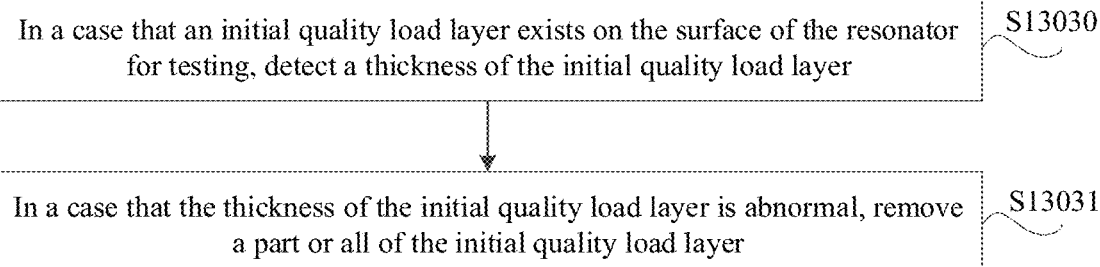
FIG. 13 is a flow chart of S1308 in FIG. 8.

In an embodiment, based on the above technical solutions, reference is made to FIG. 13, which is a flow chart of S1303. Before performing the thin film process on the resonator for testing to form the testing mass loading layer on the surface of the resonator for testing, the method includes the following steps S13030 and S13031.

In step S13030, in a case that an initial mass loading layer exists on the surface of the resonator for testing, a thickness of the initial mass loading layer is detected.

Taking FIG. 4 as an example, before forming the testing mass loading layer 006 on the surface of the resonator 200 for testing by performing the thin film process, in a case that an initial mass loading layer exists on the surface of the resonator 200 for testing, it is required to detect the thickness of the initial mass loading layer.

In step S13031, in a case that the thickness of the initial mass loading layer is abnormal, a part or all of the initial mass loading layer is removed.

In a case that the thickness of the initial mass loading layer is abnormal, it is required to remove a part or all of the initial mass loading layer by performing a trim process.

Further, taking FIG. 4 as an example, the thickness of the initial mass loading layer is determined abnormal by: determining that a vertical spacing distance between the initial mass loading layer between the first testing electrode 1 and the second testing electrode 2 and the first testing electrode 1 is less than or equal to the thickness of the testing mass loading layer 006 and a vertical spacing distance between the initial mass loading layer between the first testing electrode 1 and the second testing electrode 2 and the second testing electrode 2 is less than or equal to the thickness of the testing mass loading layer 006.

The purpose of removing a part or all of the initial mass loading layer by performing a trim process is that, after forming the testing mass loading layer 006, at least a part of the initial mass loading layer is removed to avoid the connection between the first testing electrode 1 and the second testing electrode 2 in a case that the testing mass loading layer 006 is a conductive testing mass loading layer, thereby avoiding a short circuit between the first testing electrode 1 and the second testing electrode 2. Before forming the testing mass loading layer 006 on the resonator 200 for testing, if it is determined that the thickness of the initial mass loading layer is abnormal, it is required to remove a part or all of the initial mass loading layer by performing a trim process, thereby using the resonator 200 for testing multiple times in performing the resonator testing process. The main structure of the resonator 200 for testing (including the testing substrate 007, the testing bottom electrode 008, the testing piezoelectric layer 009, and the testing top electrode 0010) is used multiple times, thereby using the resonator 200 for testing multiple times. Since the resonator 200 for testing may be used multiple times, the overall number of the resonator 200 for testing may be reduced, thereby reducing the testing cost of the resonator.

It should be noted that the reason why an initial mass loading layer exists on the resonator 200 for testing is that, before forming the current testing mass loading layer 006 to test the resonator 200 for testing, at least one testing mass loading layer 006 has been formed on the surface of the resonator 200 for testing and at least one resonator testing process has been performed, and the testing mass loading layer 006 formed before the current testing mass loading layer 006 has not been or has not been completely removed.

In an embodiment, based on the above technical solutions, the testing mass loading layer 006 includes a conductive testing mass loading layer, then the step S1304, in which the resonant frequency of the resonator for testing is detected, include: inserting a probe in a testing mass loading layer covering the first testing electrode and inserting the probe in a testing mass loading layer covering the second testing electrode to detect the resonant frequency of the resonator for testing.

Taking FIG. 4 as an example, since the testing mass loading layer 006 includes a conductive testing mass loading layer, the probe may be directly inserted to the testing mass loading layer 006 covering the first testing electrode 1 and the testing mass loading layer 006 covering the second testing electrode 2 to detect the resonant frequency of the resonator 200 for testing.

Alternatively, based on the above technical solutions, the testing mass loading layer 006 includes an insulation testing mass loading layer, then the step S1304, in which the resonant frequency of the resonator for testing is detected, include: inserting a probe through the testing mass loading layer to the first testing electrode and inserting the probe through the testing mass loading layer to the second testing electrode to detect the resonant frequency of the resonator for testing.

Taking FIG. 4 as an example, since the testing mass loading layer 006 includes an insulation testing mass loading layer, it is required to insert the probe to the first testing electrode 1 and the second testing electrode 2 through the testing mass loading layer 006 to detect the resonant frequency of the resonator 200 for testing.

A resonator for testing is further provided according to the present disclosure. Referring to FIGS. 9 to 11, the resonator 200 for testing includes: a testing substrate 007, a testing bottom electrode 008, a testing piezoelectric layer 009, a testing top electrode 0010, at least one first testing electrode 1, and at least one second testing electrode 2. The first testing electrode 1 is connected to the testing bottom electrode 008. The second testing electrode 2 is connected to the testing top electrode 0010. A spacing region is arranged between the first testing electrode 1 and the second testing electrode 2. A thickness between the testing piezoelectric layer 009 and at least one of the first testing electrode 1 and the second testing electrode 2 is greater than a predetermined thickness, so that the first testing electrode 1 and the second testing electrode 2 are insulated. In FIG. 9, both a thickness between the first testing electrode 1 and the testing piezoelectric layer 009 and a thickness between the second testing electrode 2 and the testing piezoelectric layer 009 are greater than the predetermined thickness, so that the first testing electrode 1 and the second testing electrode 2 are insulated. In FIG. 10, a thickness between the first testing electrode 1 and the testing piezoelectric layer 009 is greater than the predetermined thickness, so that the first testing electrode 1 and the second testing electrode 2 are insulated. In FIG. 11, a thickness between the second testing electrode 2 and the testing piezoelectric layer 009 is greater than the predetermined thickness, so that the first testing electrode 1 and the second testing electrode 2 are insulated.

In an embodiment, based on the above technical solutions, as shown in FIGS. 4 to 6, the resonator 200 for testing further includes a testing mass loading layer 006. The testing mass loading layer 006 covers the first testing electrode 1, the second testing electrode 2, and the spacing region between the first testing electrode 1 and the second testing electrode 2.

It should be noted that after a testing mass loading layer 006 is formed on the resonator 200 for testing as shown in FIGS. 9 to 11, the resonator 200 for testing corresponds to the resonator 200 for testing in FIGS. 4 to 6. The testing mass loading layer 006 covers the first testing electrode 1, the second testing electrode 2, and a spacing region between the first testing electrode 1 and the second testing electrode 2. In a case that both the thickness between the first testing electrode 1 and the testing piezoelectric layer 009 and the thickness between the second testing electrode 2 and the testing piezoelectric layer 009 are less than the thickness of the testing mass loading layer 006, if the material of the testing mass loading layer 006 is a conductive material, it cannot be guaranteed that the first testing electrode 1 and the second testing electrode 2 are insulated, and, and it cannot to apply different electrical signals to the first testing electrode 1 and the second testing electrode 2 to test and determine a resonant frequency adjustment amount of the testing mass loading layer to the resonator 200 for testing. Therefore, in the present disclosure, the predetermined thickness is greater than or equal to a thickness of the testing mass loading layer 006. Based on the above solutions, it may be avoided the problem that the resonant frequency adjustment amount of the testing mass loading layer 006 to the resonator 200 for testing cannot be detected due to a short circuit between the first testing electrode 1 and the second testing electrode 2 after the testing mass loading layer 006 is formed.

With the resonator 200 for testing according to the present disclosure, after forming the mass loading layer 005 to be tested on the surface of the semiconductor structure 100 and before forming a next film layer, it is determined that the resonant frequency adjustment amount of the testing mass loading layer 006 to the resonator 200 for testing meets a predetermined value, thereby online ensuring that the resonant frequency adjustment amount of the mass loading layer 005 to be tested to the semiconductor structure 100 meets a production requirement, and avoiding the technical problem in the conventional technology that multiple process steps exist between the step of forming the mass loading layer 005 to be tested and the step of detecting the resonance frequency adjustment amount caused by the mass loading layer 005 to be tested and a low-accurate resonance frequency adjustment amount caused by the detected mass loading layer to be tested due to fluctuations of the process steps (caused by equipment abnormalities, raw material abnormalities, abnormal process parameter configurations, and the like). With the technical solutions according to the present disclosure, the accuracy of the measurement result of the resonant frequency adjustment amount of the mass loading layer 005 to be tested to the semiconductor structure 100 is improved. According to the present disclosure, after the testing mass loading layer 006 is formed on the resonator 200 for testing, the first testing electrode 1 and the second testing electrode 2 are insulated, avoiding the problem that the resonant frequency adjustment amount of the testing mass loading layer 006 to the resonator 200 for testing cannot be detected due to a short circuit between the first testing electrode 1 and the second testing electrode 2 after the testing mass loading layer 006 is formed, thereby ensuring that the testing process can be completed.

In an embodiment, based on the above technical solutions, as shown in FIGS. 9 and 11, the second testing electrode 2 forms a suspended wing structure of the testing top electrode 0010. The suspended wing structure is arranged at an edge of the testing top electrode 0010. In the above technical solution, the second testing electrode 2, while performing the testing function of the resonator 200 for testing, forms a hanging wing structure of the testing top electrode 0010. The hanging wing structure is arranged to reduce the energy loss of the acoustic wave of the resonator 200 for testing, improving the quality factor of the resonator 200 for testing, and thereby improving the accuracy of determining the resonant frequency adjustment amount of the testing mass loading layer 006 to the resonator 200 for testing by using the resonator 200 for testing.

In an embodiment, based on the above technical solutions, as shown in FIG. 4, a first support structure 3 and a second support structure 4 with a space interval are arranged on a side of the testing piezoelectric layer 009 away from the testing bottom electrode 008. The first testing electrode 1 is arranged on a side of the first support structure 3 away from the testing piezoelectric layer 009, and the first testing electrode 1 passes through through holes on the first support structure 3 and on the testing piezoelectric layer 009 and then is connected to the testing bottom electrode 008. The second testing electrode 2 is arranged on a side of the second support structure 4 away from the testing piezoelectric layer 009, and is connected to the testing top electrode 0010. An orthographic projection of the first support structure 3 on the testing substrate 007 is arranged to be within an orthographic projection of the first testing electrode 1 on the testing substrate 007, and/or an orthographic projection of the second support structure 4 on the testing substrate 007 is arranged to be within an orthographic projection of the second testing electrode 2 on the testing substrate 007.

Figure 14:
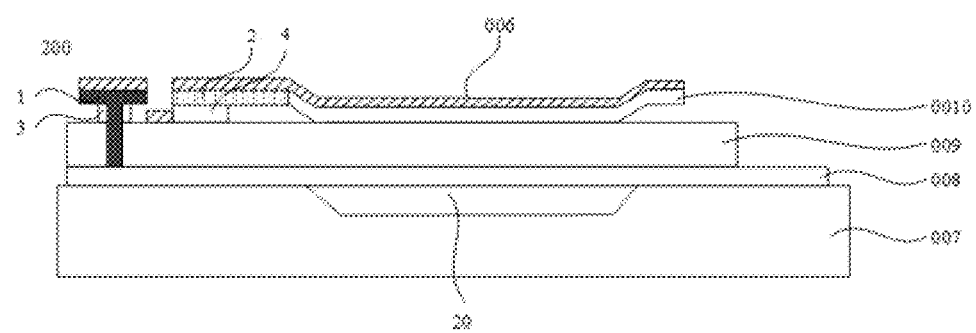
FIG. 14 is a schematic structural diagram of a resonator for testing according to a second embodiment of the present disclosure.
Figure 15:
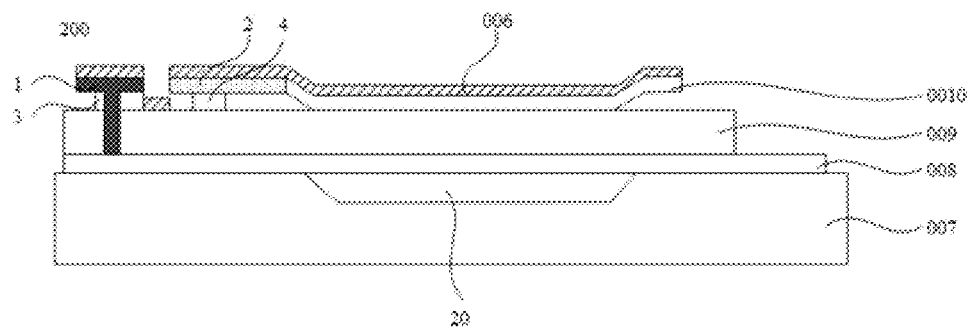
FIG. 15 is a schematic structural diagram of a resonator for testing according to a third embodiment of the present disclosure.

In FIG. 4, the orthographic projection of the first support structure 3 on the testing substrate 007 is within the orthographic projection of the first testing electrode 1 on the testing substrate 007, and the orthographic projection of the second support structure 4 on the testing substrate 007 is within the orthographic projection of the second testing electrode 2 on the testing substrate 007. In FIG. 14, the orthographic projection of the first support structure 3 on the testing substrate 007 is within the orthographic projection of the first testing electrode 1 on the testing substrate 007. In FIG. 15, the orthographic projection of the second support structure 4 on the testing substrate 007 is within the orthographic projection of the second testing electrode 2 on the testing substrate 007.

In the above technical solution, the orthographic projection of the first support structure 3 on the testing substrate 007 is within the orthographic projection of the first testing electrode 1 on the testing substrate 007, and/or the orthographic projection of the second support structure 4 on the testing substrate 007 is within the orthographic projection of the second testing electrode 2 on the testing substrate 007, avoiding connecting the testing mass loading layer 006 to the first testing electrode 1 and the second testing electrode 2. Thus, the first testing electrode 1 and the second testing electrode 2 are insulated, avoiding the problem that the resonant frequency adjustment amount of the testing mass loading layer 006 to the resonator 200 for testing cannot be detected due to a short circuit between the first testing electrode 1 and the second testing electrode 2.

Figure 16:
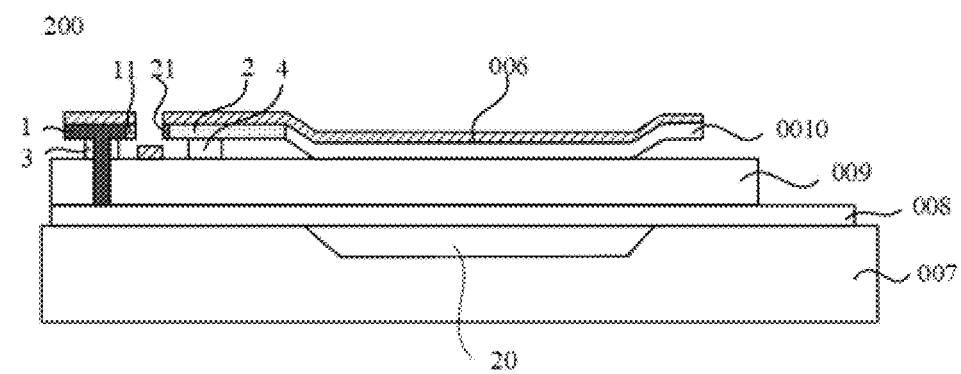
FIG. 16 is a schematic structural diagram of a resonator for testing according to a fourth embodiment of the present disclosure.

In an embodiment, based on the above technical solutions, as shown in FIG. 16, a first insulation layer 11 is arranged on a surface of the first testing electrode 1 opposite to the second testing electrode 2, and/or a second insulation layer 21 is arranged on a surface of the second testing electrode 2 opposite to the first testing electrode 1. It should be noted that FIG. 16 exemplify shows a structure in which a first insulation layer 11 is arranged on a surface of the first testing electrode 1 opposite to the second testing electrode 2 and a second insulation layer 21 is arranged on a surface of the second testing electrode 2 opposite to the first testing electrode 1.

In the above technical solutions, the first insulation layer 11 is arranged on a surface of the first testing electrode 1 opposite to the second testing electrode 2, and/or the second insulation layer 21 is arranged on a surface of the second testing electrode 2 opposite to the first testing electrode 1. After the testing mass loading layer 006 is formed, the first testing electrode 1 and the second testing electrode 2 are insulated, avoiding the problem that the resonant frequency adjustment amount of the testing mass loading layer 006 to the resonator 200 for testing cannot be detected due to a short circuit between the first testing electrode 1 and the second testing electrode 2.

Figure 17:
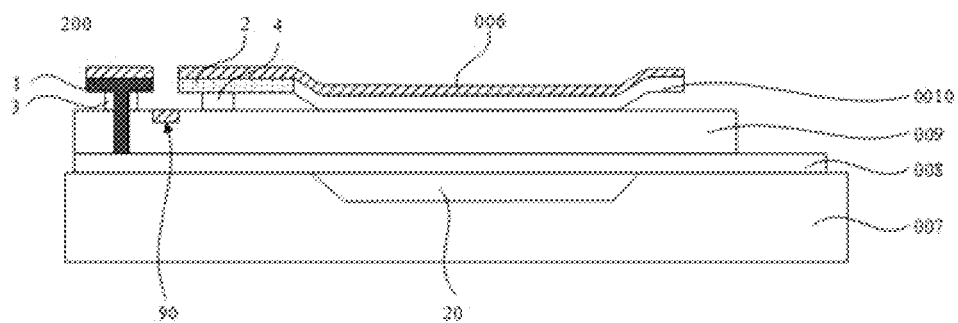
FIG. 17 is a schematic structural diagram of a resonator for testing according to a fifth embodiment of the present disclosure.

In an embodiment, based on the above technical solutions, as shown in FIG. 17, the testing piezoelectric layer 009 is defined with a groove 90, and an orthographic projection of the groove 90 on the testing piezoelectric layer 009 covers an orthographic projection of the spacing region on the testing piezoelectric layer 009, so that the first testing electrode 1 and the second testing electrode 2 are insulated after the testing mass loading layer 006 is formed.

In the above technical solutions, the testing piezoelectric layer 009 is defined with the groove 90, and the orthographic projection of the groove 90 on the testing piezoelectric layer 009 covers the orthographic projection of the spacing region, between the first testing electrode 1 and the second testing electrode 2, on the testing piezoelectric layer 009. After the testing mass loading layer 006 is formed, the testing mass loading layer 006 is located in the groove 90, avoiding connecting the testing mass loading layer 006 to the first testing electrode 1 and the second testing electrode 2. Thus, the first testing electrode 1 and the second testing electrode 2 are insulated, avoiding the problem that the resonant frequency adjustment amount of the testing mass loading layer 006 to the resonator 200 for testing cannot be detected due to a short circuit between the first testing electrode 1 and the second testing electrode 2.

In an embodiment, referring to FIGS. 4 to 6, a minimum size of an orthographic projection of the spacing region in a first direction is greater than twice the thickness of the testing mass loading layer 006, so that the space distance between the first testing electrode 1 and the second testing electrode 2 is large enough to ensure that the first testing electrode 1 and the second testing electrode 2 are insulated in the first direction. The first direction is an extension direction of the testing substrate 007, that is, the first direction is parallel to a plane where the testing substrate 007 is located. It should be noted that in the present disclosure, the first direction is the X direction shown in FIGS. 4 to 6.

In an embodiment, referring to FIGS. 5 and 6, there is a difference between a height of the first testing electrode 1 and a height of the second testing electrode 2 in a second direction. The second direction is perpendicular to the plane where the testing substrate is located. In a case that the difference is greater than twice the thickness of the testing mass loading layer 006 (the difference, between the height of the first testing electrode 1 and the height of the second testing electrode 2 in the second direction, greater than twice the thickness of the testing mass loading layer 006 is not shown in the Figures), after the testing mass loading layer 006 is formed on the resonator 200 for testing, the testing mass loading layer 006 covers the first testing electrode 1, the second testing electrode 2, and the spacing region between the first testing electrode 1 and the second testing electrode 2. In the second direction, the testing mass loading layer 006 is not connected to the first testing electrode 1 and the second testing electrode 2, thereby avoiding the problem that the resonant frequency adjustment amount of the testing mass loading layer 006 to the resonator 200 for testing cannot be detected due to a short circuit between the first testing electrode 1 and the second testing electrode 2 after forming the testing mass loading layer 006. It should be noted that in the present disclosure, the second direction is the Y direction shown in FIGS. 5 and 6.

In an embodiment, the predetermined thickness is greater than or equal to the thickness of the testing mass loading layer 006.

In the present disclosure, the thickness between the first testing electrode 1 and the testing piezoelectric layer 009 is greater than the predetermined thickness, so that the first testing electrode 1 and the second testing electrode 2 are insulated.

After a testing mass loading layer 006 is formed on the resonator 200 for testing as shown in FIGS. 9 to 11, the resonator 200 for testing corresponds to the resonator 200 for testing in FIGS. 4 to 6. The testing mass loading layer 006 covers the first testing electrode 1, the second testing electrode 2, and a spacing region between the first testing electrode 1 and the second testing electrode 2. In a case that both the thickness between the first testing electrode 1 and the testing piezoelectric layer 009 and the thickness between the second testing electrode 2 and the testing piezoelectric layer 009 are less than the thickness of the testing mass loading layer 006, if the material of the testing mass loading layer 006 is a conductive material, it cannot be guaranteed that the first testing electrode 1 and the second testing electrode 2 are insulated, and, and it cannot to apply different electrical signals to the first testing electrode 1 and the second testing electrode 2 to test and determine a resonant frequency adjustment amount of the testing mass loading layer to the resonator 200 for testing. Therefore, in the present disclosure, the predetermined thickness is greater than or equal to a thickness of the testing mass loading layer 006. Based on the above solutions, it may be avoided the problem that the resonant frequency adjustment amount of the testing mass loading layer 006 to the resonator 200 for testing cannot be detected due to a short circuit between the first testing electrode 1 and the second testing electrode 2 after the testing mass loading layer 006 is formed.

Figure 18:
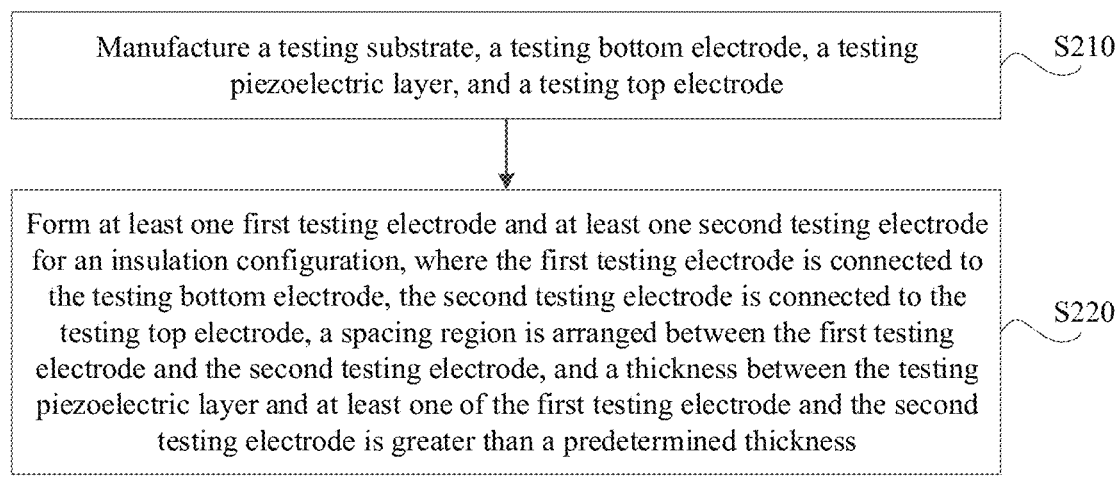
FIG. 18 is a flow chart of a method for manufacturing a resonator for testing according to the present disclosure.

A method for manufacturing a resonator for testing is further provided according to the present disclosure. Reference is made to FIG. 18, which is a flowchart of a method for manufacturing a resonator for testing according to the present disclosure. The method for manufacturing a resonator for testing includes the following steps S210 and S220.

In step S210, a testing substrate, a testing bottom electrode, a testing piezoelectric layer, and a testing top electrode are manufactured.

Figure 19:
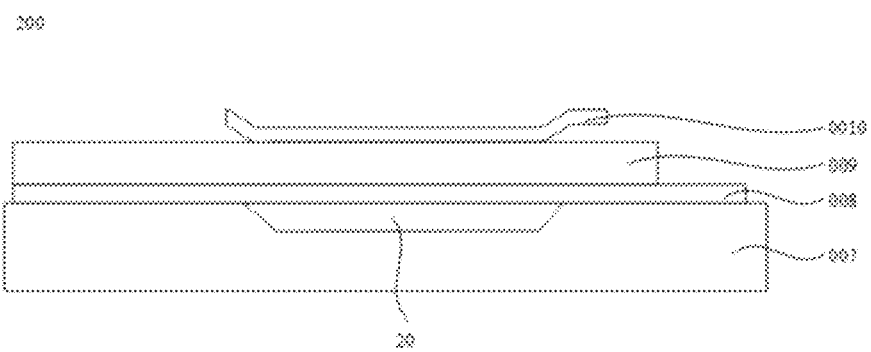
FIGS. 19 to 21 are schematic structural diagram corresponding to steps of a method for manufacturing a resonator for testing according to the present disclosure.

Referring to FIG. 19, a testing substrate 007, a testing bottom electrode 008, a testing piezoelectric layer 009, and a testing top electrode 0010 are manufactured. Specifically, a testing bottom electrode 008, a testing piezoelectric layer 009 and a testing top electrode 0010 that have predetermined shapes are formed on the surface of the testing substrate 007 by performing a thin film process and a graphical process. In order to improve the quality factors, an acoustic reflection structure, such as a cavity structure 20, is further defined in the substrate 001.

In step S220, at least one first testing electrode and at least one second testing electrode for an insulation configuration are formed. The first testing electrode is connected to the testing bottom electrode, the second testing electrode is connected to the testing top electrode, a spacing region is arranged between the first testing electrode and the second testing electrode, and a thickness between the testing piezoelectric layer and at least one of the first testing electrode and the second testing electrode is greater than a predetermined thickness.

Referring to FIGS. 9 to 11, at least one first testing electrode 1 and and at least one second testing electrode 2 are formed by performing a film forming process. The first testing electrode 1 is connected to the testing bottom electrode 008. The second testing electrode 2 is connected to the testing top electrode 0010. A spacing region is arranged between the first testing electrode 1 and the second testing electrode 2. A thickness between the testing piezoelectric layer 009 and at least one of the first testing electrode 1 and the second testing electrode 2 is greater than a predetermined thickness, so that the first testing electrode 1 and the second testing electrode 2 are insulated. In FIG. 9, both a thickness between the first testing electrode 1 and the testing piezoelectric layer 009 and a thickness between the second testing electrode 2 and the testing piezoelectric layer 009 are greater than the predetermined thickness, so that the first testing electrode 1 and the second testing electrode 2 are insulated. In FIG. 10, a thickness between the first testing electrode 1 and the testing piezoelectric layer 009 is greater than the predetermined thickness, so that the first testing electrode 1 and the second testing electrode 2 are insulated. In FIG. 11, a thickness between the second testing electrode 2 and the testing piezoelectric layer 009 is greater than the predetermined thickness, so that the first testing electrode 1 and the second testing electrode 2 are insulated.

With the resonator 200 for testing according to the present disclosure, after forming the mass loading layer 005 to be tested on the surface of the semiconductor structure 100 and before forming a next film layer, it is determined that the resonant frequency adjustment amount of the testing mass loading layer 006 to the resonator 200 for testing meets a predetermined value, thereby online ensuring that the resonant frequency adjustment amount of the mass loading layer 005 to be tested to the semiconductor structure 100 meets a production requirement, and avoiding the technical problem in the conventional technology that multiple process steps exist between the step of forming the mass loading layer 005 to be tested and the step of detecting the resonance frequency adjustment amount caused by the mass loading layer 005 to be tested and a low-accurate resonance frequency adjustment amount caused by the detected mass loading layer to be tested due to fluctuations of the process steps (caused by equipment abnormalities, raw material abnormalities, abnormal process parameter configurations, and the like). With the technical solutions according to the present disclosure, the accuracy of the measurement result of the resonant frequency adjustment amount of the mass loading layer 005 to be tested to the semiconductor structure 100 is improved. According to the present disclosure, after the testing mass loading layer 006 is formed on the resonator 200 for testing, the first testing electrode 1 and the second testing electrode 2 are insulated, avoiding the problem that the resonant frequency adjustment amount of the testing mass loading layer 006 to the resonator 200 for testing cannot be detected due to a short circuit between the first testing electrode 1 and the second testing electrode 2 after the testing mass loading layer 006 is formed, thereby ensuring that the testing process can be completed.

In an embodiment, based on the above technical solutions, the step S220, in which the second testing electrode is formed, includes: referring to FIGS. 9 and 11, forming the second testing electrode 2 that forms a suspended wing structure of the testing top electrode 0010. The suspended wing structure is arranged at an edge of the testing top electrode 0010.

In the above technical solution, the second testing electrode 2, while performing the testing function of the resonator 200 for testing, forms a hanging wing structure of the testing top electrode 0010. The hanging wing structure is arranged to reduce the energy loss of the acoustic wave of the resonator 200 for testing, improving the quality factor of the resonator 200 for testing, and thereby improving the accuracy of determining the resonant frequency adjustment amount of the testing mass loading layer 006 to the resonator 200 for testing by using the resonator 200 for testing.

In an embodiment, based on the above technical solutions, taking the resonator for testing shown in FIG. 9 as an example, the step S220, in which at least one first testing electrode and at least one second testing electrode for an insulation configuration are formed, includes the following steps S2201 to S2204.

In step S2201, a first support structure and a second support structure with a space interval are arranged on a side of the testing piezoelectric layer away from the testing bottom electrode.

Figure 20:
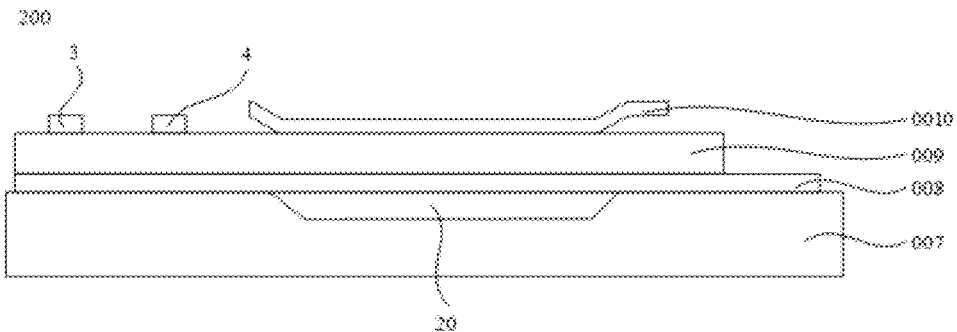

Referring to FIG. 20, a first support structure 3 and a second support structure 4 are arranged on a side of the testing piezoelectric layer 009 away from the testing bottom electrode 008, and the first support structure 3 and the second support structure 4 are arranged with a space interval. The first support structure 3 and the second support structure 4 may be made of an insulation material.

In step S2202, through holes are defined in the first support structure and the testing piezoelectric layer.

Figure 21:
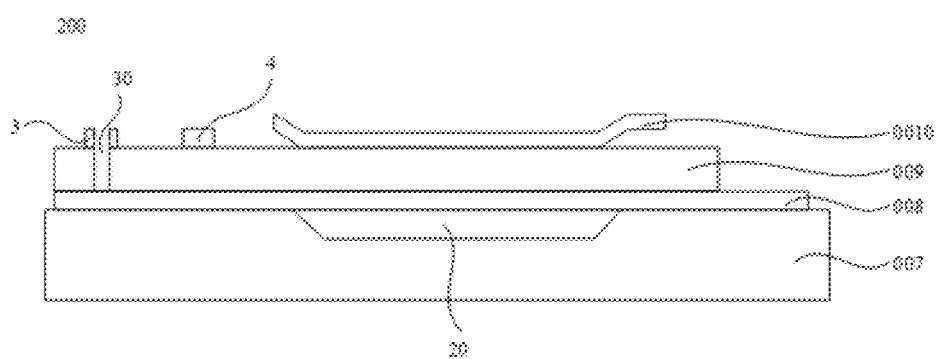

Referring to FIG. 21, through holes 30 are defined in the first support structure 3 and in the testing piezoelectric layer 009 by performing an etching process. With the through holes 30, the first testing electrode 1 that covers the first support structure 3 is connected to the testing bottom electrode 008.

In step S2203, the first testing electrode is formed on a side of the first support structure away from the testing piezoelectric layer. The first testing electrode passes through the through holes and then is connected to the testing bottom electrode.

In step S2204, the second testing electrode is formed on a side of the second support structure away from the testing piezoelectric layer. The second testing electrode is connected to the testing top electrode.

Referring to FIG. 9, a first testing electrode 1 and a second testing electrode 2 are formed by performing the thin film process. The first testing electrode 1 is arranged on a side of the first support structure 3 away from the testing piezoelectric layer 009, and the first testing electrode 1 passes through through holes on the first support structure 3 and on the testing piezoelectric layer 009 and then is connected to the testing bottom electrode 008. The second testing electrode 2 is arranged on a side of the second support structure 4 away from the testing piezoelectric layer 009, and is connected to the testing top electrode 0010. An orthographic projection of the first support structure 3 on the testing substrate 007 is arranged to be within an orthographic projection of the first testing electrode 1 on the testing substrate 007, and/or an orthographic projection of the second support structure 4 on the testing substrate 007 is arranged to be within an orthographic projection of the second testing electrode 2 on the testing substrate 007.

In FIG. 9, the orthographic projection of the first support structure 3 on the testing substrate 007 is within the orthographic projection of the first testing electrode 1 on the testing substrate 007, and the orthographic projection of the second support structure 4 on the testing substrate 007 is within the orthographic projection of the second testing electrode 2 on the testing substrate 007. In FIG. 14, the orthographic projection of the first support structure 3 on the testing substrate 007 is within the orthographic projection of the first testing electrode 1 on the testing substrate 007. In FIG. 15, the orthographic projection of the second support structure 4 on the testing substrate 007 is within the orthographic projection of the second testing electrode 2 on the testing substrate 007. It should be noted that FIGS. 14 and 15 show schematic structural diagrams of a resonator 200 for testing on which a testing mass loading layer 006 is formed.

In the above technical solution, the orthographic projection of the first support structure 3 on the testing substrate 007 is within the orthographic projection of the first testing electrode 1 on the testing substrate 007, and/or the orthographic projection of the second support structure 4 on the testing substrate 007 is within the orthographic projection of the second testing electrode 2 on the testing substrate 007, avoiding connecting the testing mass loading layer 006 to the first testing electrode 1 and the second testing electrode 2. Thus, the first testing electrode 1 and the second testing electrode 2 are insulated, avoiding the problem that the resonant frequency adjustment amount of the testing mass loading layer 006 to the resonator 200 for testing cannot be detected due to a short circuit between the first testing electrode 1 and the second testing electrode 2.

In an embodiment, based on the above technical solutions, the step S220, in which at least one first testing electrode and at least one second testing electrode for an insulation configuration are formed, includes the following steps S2205 and S2206.

In step S2205, the at least one first testing electrode and the at least one second testing electrode are formed on a side of the testing piezoelectric layer away from the testing bottom electrode.

In step S2206, a first insulation layer is arranged on a surface of the first testing electrode opposite to the second testing electrode, and/or a second insulation layer is arranged on a surface of the second testing electrode opposite to the first testing electrode.

As shown in FIG. 16, the at least one first testing electrode 1 and the at least one second testing electrode 2 are formed on a side of the testing piezoelectric layer 009 away from the testing bottom electrode by performing the thin film process. In addition, by performing the thin film process, a first insulation layer 11 is arranged on a surface of the first testing electrode 1 opposite to the second testing electrode 2, and/or a second insulation layer 21 is arranged on a surface of the second testing electrode 2 opposite to the first testing electrode 1. FIG. 16 exemplify shows a structure in which a first insulation layer 11 is arranged on a surface of the first testing electrode 1 opposite to the second testing electrode 2 and a second insulation layer 21 is arranged on a surface of the second testing electrode 2 opposite to the first testing electrode 1.

In the above technical solutions, the first insulation layer 11 is arranged on a surface of the first testing electrode 1 opposite to the second testing electrode 2, and/or the second insulation layer 21 is arranged on a surface of the second testing electrode 2 opposite to the first testing electrode 1. After the testing mass loading layer 006 is formed, the first testing electrode 1 and the second testing electrode 2 are insulated, avoiding the problem that the resonant frequency adjustment amount of the testing mass loading layer 006 to the resonator 200 for testing cannot be detected due to a short circuit between the first testing electrode 1 and the second testing electrode 2.

In an embodiment, based on the above technical solutions, after the step S220 in which the at least one first testing electrode and the at least one second testing electrode for an insulation configuration are formed, the method further includes: forming a testing mass loading layer, where the testing mass loading layer covers the first testing electrode, the second testing electrode and the spacing region, For the resonator 200 for testing shown in FIGS. 9 to 11, the testing mass loading layer 006 is not formed. After the testing mass loading layer 006 is formed on the resonator 200 for testing by performing a film forming process, the resonator 200 for testing corresponds to the resonator 200 for testing in FIGS. 4 to 6. The resonator 200 for testing further includes the testing mass loading layer 006, and the testing mass loading layer 006 covers the first testing electrode 1, the second testing electrode 2, and the spacing region between the first testing electrode 1 and the second testing electrode 2.

Since the spacing region is arranged between the first testing electrode 1 and the second testing electrode 2, and the thickness between the testing piezoelectric layer 009 and at least one of the first testing electrode 1 and the second testing electrode 2 is greater than the thickness of the testing mass loading layer 006, so that the first testing electrode 1 and the second testing electrode 2 are insulated. Based on the above solutions, it may be avoided the problem that the resonant frequency adjustment amount of the testing mass loading layer 006 to the resonator 200 for testing cannot be detected due to a short circuit between the first testing electrode 1 and the second testing electrode 2 after the testing mass loading layer 006 is formed.

In an embodiment, based on the above technical solutions, the step S210 in which the testing piezoelectric layer is manufactured includes: forming a groove on a surface of the testing piezoelectric layer. An orthographic projection of the groove on the testing piezoelectric layer covers an orthographic projection of the spacing region on the testing piezoelectric layer, so that the first testing electrode and the second testing electrode are insulated after the testing mass loading layer is formed.

Referring to FIG. 17, a groove 90 is defined on a surface of the testing piezoelectric layer 009 by performing an etching process. An orthographic projection of the groove 90 on the testing piezoelectric layer 009 covers an orthographic projection of the spacing region on the testing piezoelectric layer 009, so that the first testing electrode 1 and the second testing electrode 2 are insulated after the testing mass loading layer 006 is formed.

In the above technical solutions, the orthographic projection of the groove 90 on the testing piezoelectric layer 009 covers the orthographic projection of the spacing region, between the first testing electrode 1 and the second testing electrode 2, on the testing piezoelectric layer 009. After the testing mass loading layer 006 is formed, the testing mass loading layer 006 is located in the groove 90, avoiding connecting the testing mass loading layer 006 to the first testing electrode 1 and the second testing electrode 2. Thus, the first testing electrode 1 and the second testing electrode 2 are insulated, avoiding the problem that the resonant frequency adjustment amount of the testing mass loading layer 006 to the resonator 200 for testing cannot be detected due to a short circuit between the first testing electrode 1 and the second testing electrode 2.

It should be understood that various forms of processes shown above may be used to reorder, add, or delete steps. For example, the steps according to the present disclosure may be executed in parallel, in sequence, or in different orders as long as expected results of the technical solutions in the present disclosure may be achieved, which is not limited herein.

The above specific embodiments are not intended to limit the protection scope of the present disclosure. Those skilled in the art should understand that various modifications, combinations, sub combinations, and replacements may be made based on design requirements and other factors. Any modifications, equivalent replacements, and improvements made within the spirit and principles of the present disclosure should fall into the protection scope of the present disclosure.

What is claimed is:

1. A resonator for testing, comprising: a testing substrate, a testing bottom electrode, a testing piezoelectric layer, a testing top electrode, at least one first testing electrode, and at least one second testing electrode; wherein the first testing electrode is connected to the testing bottom electrode; the second testing electrode is connected to the testing top electrode; a spacing region is arranged between the first testing electrode and the second testing electrode; a thickness between the testing piezoelectric layer and at least one of the first testing electrode and the second testing electrode is greater than a predetermined thickness to insulate the first testing electrode and the second testing electrode; and the first testing electrode and the second testing electrode are arranged on a same side of the testing top electrode; and the resonator for testing further comprises a testing mass loading layer; the testing mass loading layer is configured to cover the first testing electrode, the second testing electrode and the spacing region; the testing mass loading layer is a conductive testing mass loading layer; and the predetermined thickness is greater than or equal to a thickness of the testing mass loading layer.

2. The resonator for testing according to claim 1, wherein the second testing electrode is configured to form a suspended wing structure of the testing top electrode, and the suspended wing structure is arranged at an edge of the testing top electrode.

3. The resonator for testing according to claim 1, wherein a first support structure and a second support structure with a space interval are arranged on a side of the testing piezoelectric layer away from the testing bottom electrode;

the first testing electrode is arranged on a side of the first support structure away from the testing piezoelectric layer, and the first testing electrode is configured to pass through through holes on the first support structure and on the testing piezoelectric layer and then is connected to the testing bottom electrode;

the second testing electrode is arranged on a side of the second support structure away from the testing piezoelectric layer, and is connected to the testing top electrode; and an orthographic projection of the first support structure on the testing substrate is arranged to be within an orthographic projection of the first testing electrode on the testing substrate, and/or an orthographic projection of the second support structure on the testing substrate is arranged to be within an orthographic projection of the second testing electrode on the testing substrate.

4. The resonator for testing according to claim 1, wherein a first insulation layer is arranged on a surface of the first testing electrode opposite to the second testing electrode, and/or a second insulation layer is arranged on a surface of the second testing electrode opposite to the first testing electrode.

5. The resonator for testing according to claim 1, wherein the testing piezoelectric layer is defined with a groove, and an orthographic projection of the groove on the testing piezoelectric layer is configured to cover an orthographic projection of the spacing region on the testing piezoelectric layer to insulate the first testing electrode and the second testing electrode after the testing mass loading layer is formed.

6. The resonator for testing according to claim 1, wherein a minimum size of an orthographic projection of the spacing region in a first direction is greater than twice the thickness of the testing mass loading layer, and the first direction is an extension direction of the testing substrate.

7. The resonator for testing according to claim 1, wherein a difference between a height of the first testing electrode and a height of the second testing electrode in a second direction is greater than twice the thickness of the testing mass loading layer, and the second direction is perpendicular to a plane where the testing substrate is located.

* * * * *